(12) United States Patent
Kotecki et al.

(10) Patent No.: US 6,395,594 B2
(45) Date of Patent: May 28, 2002

(54) METHOD FOR SIMULTANEOUSLY FORMING A STORAGE-CAPACITOR ELECTRODE AND INTERCONNECT

(75) Inventors: David E. Kotecki, Hopewell Junction; Carl J. Radens, LaGrangeville, both of NY (US); Jeffrey P. Gambino, Gaylordsville, CT (US); Gary B. Bronner, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/750,790

(22) Filed: Jan. 2, 2001

Related U.S. Application Data (62) Division of application No. 09/300,899, filed on Apr. 28, 1999, now Pat. No. 6,201,272.

(51) Int. Cl.[7] .......................................... H01L 21/8234
(52) U.S. Cl. .................................. 438/238; 438/622
(58) Field of Search ................................ 438/618, 622, 438/238

(56) References Cited

U.S. PATENT DOCUMENTS

| | | |
|---|---|---|
| 4,958,325 A | 9/1990 | Nakagome et al. |
| 4,980,860 A | 12/1990 | Houston et al. |
| 5,012,447 A | 4/1991 | Matsuda et al. |
| 5,014,110 A | 5/1991 | Satoh |
| 5,144,583 A | 9/1992 | Oowaki et al. |
| 5,214,601 A | 5/1993 | Hidaka et al. |
| 5,292,678 A | 3/1994 | Dhong et al. |
| 5,406,512 A | 4/1995 | Kagenishi |
| 5,416,734 A | 5/1995 | Hidaka et al. |
| 5,420,816 A | 5/1995 | Ogihara et al. |
| 5,475,643 A | 12/1995 | Ohta |
| 5,550,769 A | 8/1996 | Hidaka et al. |
| 5,583,356 A | 12/1996 | Yoon et al. |
| 5,586,072 A | 12/1996 | Longway et al. |
| 5,602,772 A | 2/1997 | Nakanao et al. |
| 5,615,156 A | 3/1997 | Yoshida et al. |
| 5,986,299 A | 11/1999 | Nakamura et al. |
| 6,140,174 A * | 10/2000 | Kwon et al. ............... 438/241 |
| 6,258,649 B1 * | 7/2001 | Nakamura et al. .......... 438/238 |

* cited by examiner

*Primary Examiner*—Douglas Wille
(74) *Attorney, Agent, or Firm*—Whitham, Curtis & Christofferson; Eric W. Petraske

(57) ABSTRACT

A DRAM memory cell array includes a wiring layer formed at a storage-capacitor level of the cell for establishing a flipped connection of complementary bit lines, or for connecting support circuits in a DRAM cell array. The wiring layer includes at least one and preferably two capacitor electrodes for making both types of interconnects. A method for making the DRAM memory cell includes forming one or more capacitor electrodes at the same time the electrodes of the storage capacitor of the memory cell are formed, and from the same material as the storage capacitor electrodes.

7 Claims, 5 Drawing Sheets

METHOD FOR SIMULTANEOUSLY FORMING A STORAGE-CAPACITOR ELECTRODE AND INTERCONNECT

This is a divisional of U.S. patent application Ser. No. 09/300,899 now U.S. Pat. No. 6,201,272, filed Apr. 28, 1999, the contents of which is incorporated by reference herein.

BACKGROUND OF THE INVENTION

1. Field of the Invention

The present invention generally relates to integrated circuits, and more particularly to structures and methods for forming interconnections within a semiconductor memory.

2. Description of the Prior Art

Generally speaking, there are two types of semiconductor memories. In the first type, data stored in the individual cell locations of the memory cannot be altered. Consequently, these memories are referred to as read-only memories. In the second type, data stored in each cell location can be altered, i.e., are subject to both read and write operations. The latter memories have therefore been called random-access memories.

Random-access memories (RAMs) come in various forms. Static random-access memories (SRAMs), for example, store data as long as they are connected to a power source. They also provide extremely rapid access, but at the cost of substantial power consumption, expense, and wafer space. Dynamic random access memories (DRAMs) use capacitive storage and thus must be re-written or refreshed on a periodic basis. They, however, are more economical and have improved storage density and power consumption requirements compared with SRAMs and thus their advantages have given engineers sufficient incentive to design around their drawbacks. DRAMs, therefore, remain the preferred choice of random-access memory for most chip designers.

Structurally speaking, a DRAM is formed from a plurality of memory cells arranged in the form of a matrix. Each cell includes a storage capacitor and a series-connected transistor, which is controlled by a word line running orthogonally to a pair of bit lines connected to a sense amplifier. To read data from the cell, the word line and sense amplifier are activated to cause the capacitor to output its charge to an associated one of a pair of bit lines. This charge causes a voltage imbalance to occur between the bit lines, which imbalance is amplified by the sense amplifier to a level representing a logical "0" or "1." DRAMs of this type are disclosed, for example, in U.S. Pat. Nos. 5,012,447 and 5,416,734.

One effect which reduces the operational efficiency of a DRAM is noise which is capacitively coupled between adjacent bit lines. This noise, among other things, causes the sense amplifiers of the DRAM to output erroneous logic values. To reduce noise, it is common practice to cross (or "flip") complementary bit lines at one or more locations along their length. Flipping bit lines in this manner reduces capacitive coupling and thus improves the overall accuracy of the memory. U.S. Pat. Nos. 5,550,769, 5,475,643, 5,214,601, 5,014,110, 5,012,447, and 4,980,860 disclose flipped bit-line DRAMs of this type.

DRAMs of the aforementioned type use dedicated wiring layers to form the flipped connections between their bit lines. Dedicated wiring layers are undesirable because they increase the cost and complexity of the fabrication process, as well as reduce integration density. Moreover, the storage capacitors in these DRAMs are often formed in layers beneath the bit lines, which further reduces integration density. U.S. Pat. Nos. 5,602,772 and 5,292,678 disclose DRAMs of this type.

Many conventional DRAMs, including those having flipped bit-lines, use stacked capacitors in their cells because of the increased electrode area and node capacitance they provide. The height of these capacitors, however, has proven troublesome because of the additional cost required in patterning their thick lower electrode, which further reduces integration density. The article, S. Sim et al. IEDM, 1996 discloses a conventional DRAM using stacked capacitors.

Attempts have been made to increase the integration density of a DRAM. U.S. Pat. No. 5,406,512 to Kagenishi, for example, proposes to form one electrode of a compensation capacitor from a portion of a bit line. The Kagenishi approach, however, actually decreases integration density because any improvement realized from using a bit line as a capacitor electrode is offset by the presence of compensation capacitors in the first place.

The Inventors of the present invention have recognized that space in the storage-capacitor-electrode level of a DRAM memory cell, for example, in a so-called support region (e.g. where support circuits such as decoders and sense amplifiers are located), has not been used for wiring or interconnection purposes. Using the support area in this manner, e.g., as an area in which connections to support circuits can be routed, would be particularly advantageous in improving the integration of a DRAM memory cell.

SUMMARY OF THE INVENTION

It is a first objective of the present invention to increase the integration density of a DRAM and simultaneously reduce its manufacturing costs.

It is second objective of the present invention to achieve the first objective by incorporating a wiring layer into an intermediate level of at least one memory cell of the DRAM and then using that wiring layer as a chip interconnect and/or any one of a variety of other purposes.

It is another objective of the present invention to form the aforementioned wiring layer in a level of a DRAM memory cell where at least one storage capacitor is located, and preferably in a support-circuit region within that level.

It is another objective of the present invention to form a DRAM memory cell having the aforementioned wiring layer, wherein the wiring layer includes at least one extra capacitor electrode formed at the storage-capacitor level of the cell.

It is another objective of the present invention to provide a DRAM memory cell of the aforementioned type, wherein the storage-capacitor level of the memory cell is located between chip interconnects and/or complementary bit lines of the DRAM, thereby increasing integration density compared with conventional DRAMs which use special, dedicated wiring levels to make these interconnections.

It is another objective of the present invention to form a DRAM memory cell of the aforementioned type in a region where bit lines of the DRAM are flipped, and then to use the capacitor electrode of the memory cell to establish a flip connection for at least one of the bit lines.

It is another objective of the present invention to provide a memory cell of the aforementioned type, wherein the capacitor electrode electrically connects one or more support circuits of the DRAM.

It is another objective of the present invention to provide a method for making a DRAM memory cell of the aforementioned type, wherein the capacitor electrode is formed simultaneously with an electrode of at least one of the storage capacitors of the cell, thereby reducing the number of steps and the cost required to make the DRAM.

It is another objective of the present invention to provide a method for making a DRAM memory cell of the aforementioned type, wherein the capacitor electrode and the storage capacitor plates in the cell are made from a same conductive material.

These and other objects of the present invention are achieved by providing a DRAM memory cell having a first layer including at least one transfer gate, a second layer including a first signal line, a third layer including a second signal line, and an intermediate layer containing a storage capacitor and a wiring layer including a capacitor electrode for connecting the first and second signal lines. To improve integration density of the memory cell, the intermediate layer containing the capacitor electrode is disposed between second and third layers. The capacitor electrode, preferably, is a stacked capacitor electrode constructed on a plane even with and from the same material as one electrode of the storage capacitor. This material may include platinum or iridium.

In an alternative embodiment, the memory cell of the present invention may include a second capacitor electrode in the third layer of the cell. The second capacitor electrode is formed adjacent the first capacitor electrode and is separated therefrom by a dielectric. Advantageously, the first and second capacitor electrodes may form any one of a variety of chip interconnections, including flipped bit-line connections, support circuit interconnects, as well as local and global wiring.

The method for making a DRAM memory cell forms the first capacitor electrode simultaneously with one electrode of the storage capacitor, and preferably from the same conductive material. Further, the first capacitor electrode is formed between first and second signal lines which are connected by the first capacitor electrode. Contact studs, made, for example, from tungsten, connect the electrode to the bit lines. A second capacitor electrode may then be formed adjacent to and within the same layer as the first capacitor electrode to form additional interconnects. Preferably, the second capacitor electrode is formed from a damascene process.

BRIEF DESCRIPTION OF THE DRAWINGS

The foregoing and other objects, aspects and advantages will be better understood from the following detailed description of a preferred embodiment of the invention with reference to the drawings, in which:

FIG. 4 is a top view of the memory cell as shown in FIG. 3, FIGS. 5(a)–(f) show steps included in a first embodiment of the method of the present invention, and a DRAM cell structure formed in accordance with those steps.

DETAILED DESCRIPTION OF A PREFERRED EMBODIMENT OF THE INVENTION

The present invention is, in one respect, a semiconductor memory cell having an intermediate wiring layer for electrically connecting one or more bit lines or interconnects of a memory device. The present invention is, in a second respect, a method for making a memory cell having the aformentioned intermediate wiring layer. All of the embodiments described herein may advantageously be incorporated within and/or used to form the memory cells of a DRAM and are described below in this context. One skilled in the art can appreciate, however, that the invention may also be used in to form the cells of other types of memory technologies.

Figure 1:
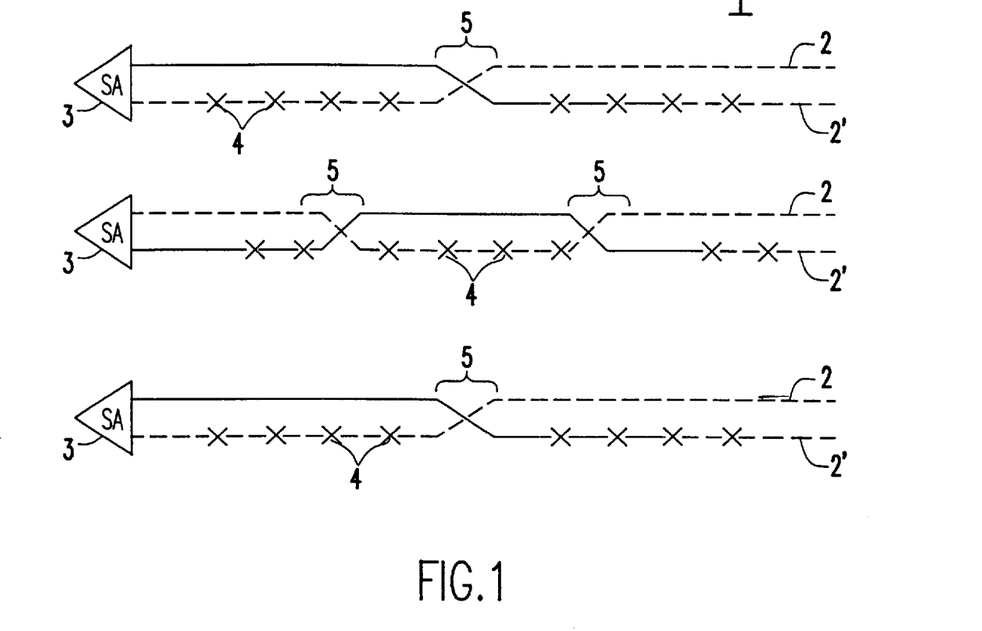
FIG. 1 is a diagram of a DRAM having complementary pairs of bit lines flipped one or more times along their lengths.

Referring now to the drawings, and more particularly to FIG. 1, a DRAM cell array 1 is shown as including a plurality of bit lines 2, 2' grouped in complementary pairs and connected to respective sense amplifiers 3. Disposed at selected locations along the bit lines are memory cells 4, which store data of the cell array at individual address locations. As shown, the bit lines in each pair are crossed (or flipped) in at least one location 5 along their length to minimize the effects of noise derived from capacitive coupling between nearby or adjacent bit lines. (Other elements of the DRAM array, including word lines and associated row/column address decoders, have been omitted from FIG. 1 for the sake of clarity.)

The semiconductor memory cell of the present invention may be included in the device of FIG. 1 to advantageously reduce the overall integration density of the DRAM cell array.

Figure 2:
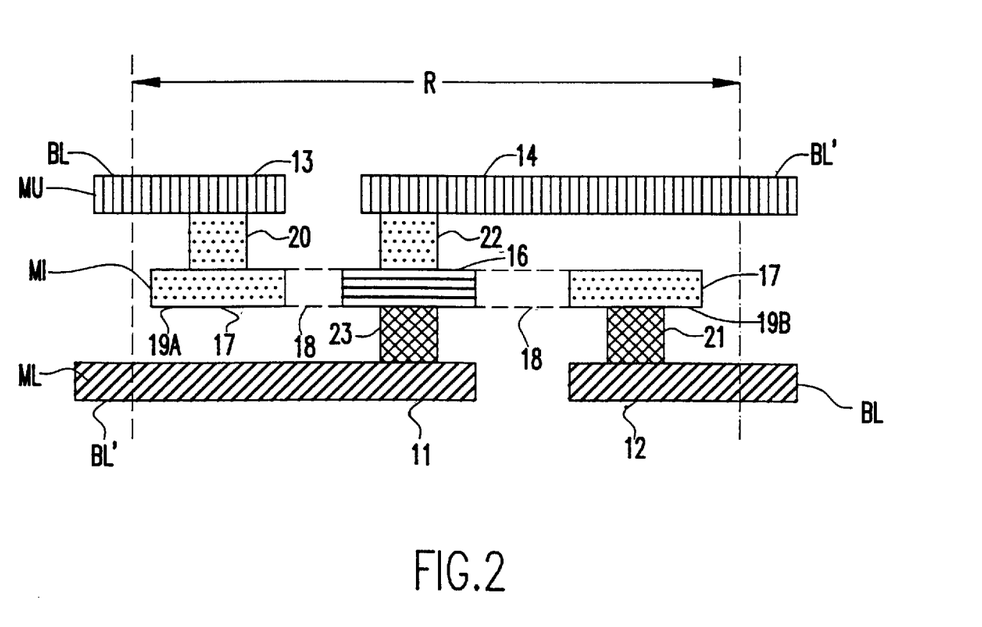
FIG. 2 is a cross-sectional view of the an intermediate wiring layer formed in accordance with the present invention to establish flipped connections between two bit lines.

FIG. 2 is a schematic diagram showing three wiring levels ML, MI, and MU in a first embodiment of the DRAM memory cell 10 of the present invention. Lower wiring level ML includes metal layers 11 and 12, upper wiring level MU includes metal layers 13 and 14, and intermediate wiring level MI, disposed between the upper and lower wiring levels, includes capacitor electrodes 16 and 17. As indicated by hidden lines 18, the ends 19a and 19b of electrodes 17 are connected by a metallization layer formed behind capacitor electrode 16. (The transfer gates, storage capacitors, and other features of the memory cell have been omitted in FIG. 2 for the sake of illustrating the intermediate wiring layer.)

The memory cell of the invention differs, in at least one way, from conventional memory cells by this intermediate wiring level. Specifically, capacitor electrodes 16 and 17 are formed on the same level as a storage capacitor of the cell, preferably in a region where support circuits are located. In accordance with the invention, the capacitors electrodes define a wiring layer in this level for connecting metal layers 11–14 at different levels of the cell. Because the electrodes are formed between the metal layers which they connect, the integration density of the memory cell and thus the overall DRAM device is increased compared with those conventionally known.

The memory cell structure shown in FIG. 2, more specifically, may be used to establish electrical connections in at least three contexts. In the first context, metal layers 12 and 13 and metal layers 11 and 14 respectively form a pair of complementary bit lines BL and BL' which are flipped in a region R through electrical connections running through storage electrodes 16 and 17. To establish the flip connection of bit line BL, a stud 20 electrically connects metal layer 13 to end 19a of capacitor electrode 17, and to complete the connection, a stud 21 electrically connects end 19b of capacitor electrode 17 to metal layer 12. Similarly, to establish the flip connection of bit line BL', studs 22 and 23 electrically connect capacitor electrode 16 to metal layers 14 and 11, respectively.

In the second context, one of capacitor electrodes 16 and 17 is used as a wiring layer for connecting an interconnect 14 to an interconnect 11. Under these circumstances, for example, capacitor electrode 16 may connect the memory cell in which it is incorporated to one or more support circuits of the DRAM cell array (e.g., sense amplifier, word lines, row/column address decoders, etc.), or capacitor electrode 16 may interconnect elements dis-associated with the memory cell per se. In this latter application, capacitor 16 may interconnect two support circuits in the DRAM cell array, interconnect a support circuit to logic device in the array, or connect a support circuit of the array to one or more off-chip logic or input/output devices.

In the third context, both capacitor electrodes are used to perform both types of connections discussed above, e.g., capacitor electrode 16 may be used to establish a flip connection between a bit line formed from metal layers 11 and 14 and capacitor electrode 17 may electrically connect support circuits in the array through interconnects 12 and 13.

In the foregoing figures, the bit lines of the DRAM cell array have been described as being disposed in different vertical planes, or levels, of the cell. Those skilled in the art can appreciate, however, that the intermediate wiring layers of the present invention may be applied, by analogy, when the bit lines are arranged side-by-side within the same vertical plane.

In conventional DRAM memory cell structures, additional wiring levels must be added to the cross-sectional topology of the cell in order to establish flipped bit-line connections. The present invention represents a substantial improvement over these conventional structures by connecting bit lines in the flipped region using the existing levels and more specifically the intermediate storage-capacitor level of the memory cell. Thus, with the present invention, the bit lines are connected in the flipped region without using additional wiring layers, and for at least this reason, the memory cell of the present invention achieves a greater degree of integration density compared with those conventionally known.

Figure 3:
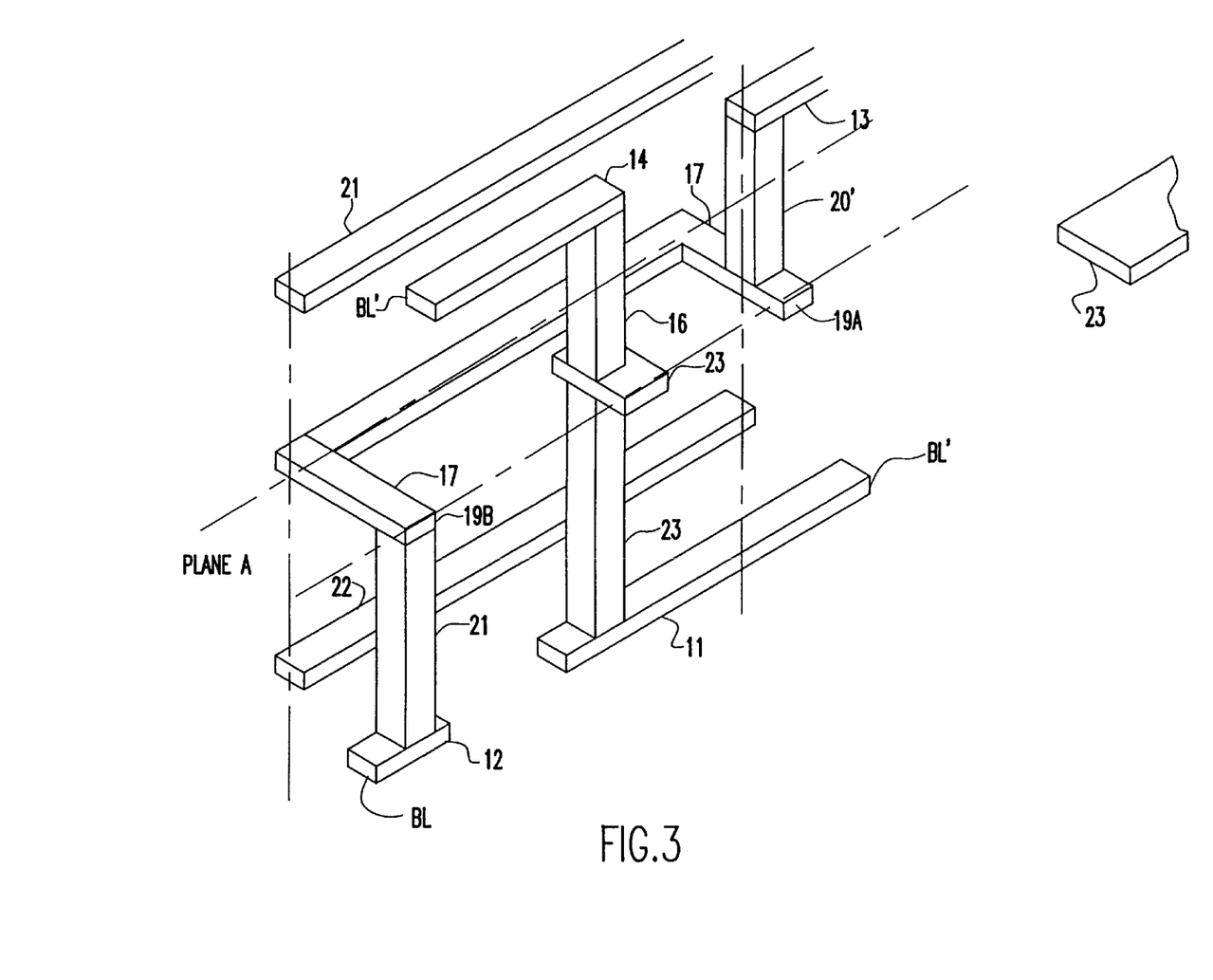
FIG. 3 is three-dimensional view of the bit-line flip connection shown in FIG. 2.

FIG. 3 is a three-dimensional diagram of the wiring levels shown in FIG. 2 and has been included to illustrate a preferred way in which one or more of the capacitor electrodes of the memory cell of the present invention may be constructed. For consistency reasons, FIGS. 2 and 3 use like reference numerals where appropriate.

As shown FIG. 3, the bit line flip connections are made in an intermediate plane A by capacitor electrode 16 and capacitor electrode 17 which partially surrounds electrode 16. Studs 20 and 21 connect portions 12 and 13 of bit line BL, and studs 22 and 23 connect portions 11 and 14 of bit line BL'. Metal layers/bit lines 21 and 22 for a different sense amplifier and lower electrode capacitor 23 are also shown.

Figure 4:
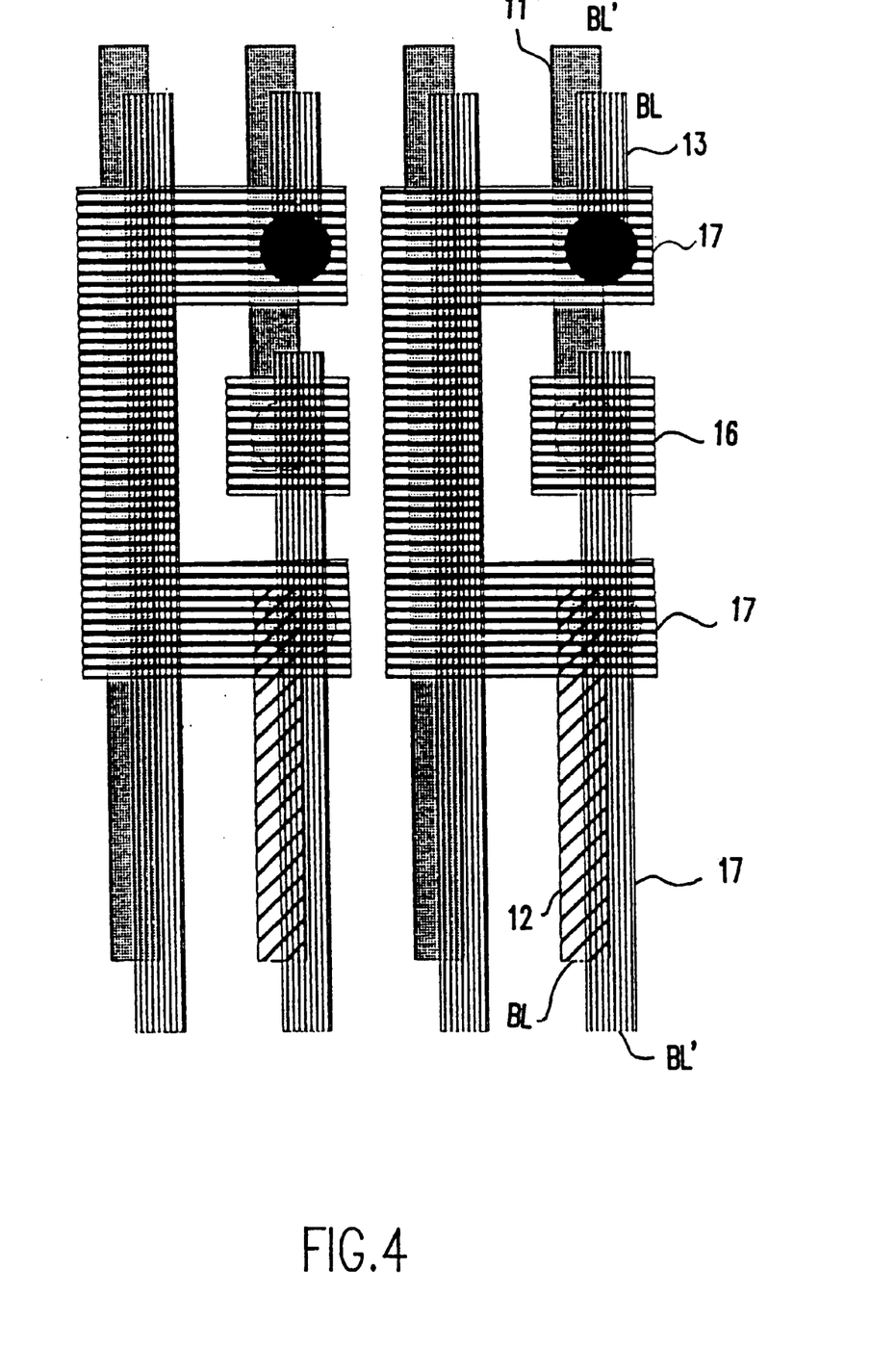

FIG. 4 shows a top view of how the bit lines BL and BL' are connected in the flip region in accordance with the present invention, with like numerals included.

The method for making a DRAM memory cell in accordance with the present invention advantageously forms at least one of the capacitor electrodes previously described on the same level (i.e., within the same vertical plane) as a storage capacitor of the memory cell, thereby avoiding the need for additional or specially dedicated wiring layers for establishing bit-line and other forms of interconnections.

Further, to streamline the cell fabrication process, the capacitor electrode and at least one plate of the storage capacitor are simultaneously formed from a same conductive material. (The term "capacitor electrode" is to be distinguished from "storage capacitor" in that the former refers to a conductive layer which forms the intermediate wiring layer of the present invention. The latter refers to the element which holds the charge, or data, of the memory cell. As will become apparent below, the capacitor electrode and at least one plate of the storage capacitor are preferably formed simultaneously.)

Referring to FIG. 5, a first embodiment of the method of present invention forms a DRAM memory cell having a lower capacitor electrode formed as a wiring layer in an intermediate level of the cell containing two storage capacitors. Preferably, the lower capacitor electrode is a stacked capacitor electrode.

Figure 5A:
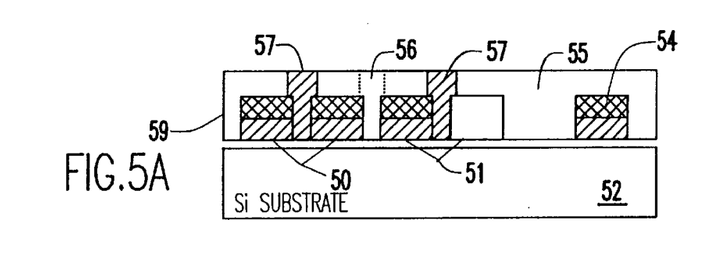

As shown in FIG. 5(a), the method begins by forming transfer gates 50 and 51 (with accompanying spacers and liners) in a first level 59 on a silicon substrate 52. The transfer gates control the reading and writing of data to and from storage capacitors formed in subsequent steps of the method. Each transfer gate may be constructed from a polysilicon layer followed by a silicon nitride layer, however one skilled in the art can appreciate that any of a variety of materials may be used to form the transfer gate structures. Also formed on substrate 15 is a support device 54.

Next, a layer 55 of borophosphosilicate glass (BPSG) is deposited over the transfer gates and planarized back to a desired thickness using lithography and reactive ion etching (RIE). Array contacts, including bitline contact 56 and capacitor contacts (or studs) 57, are then formed by creating vias in the BPSG layer and then filling them with a conductive material such as polysilicon.

Figure 5B:
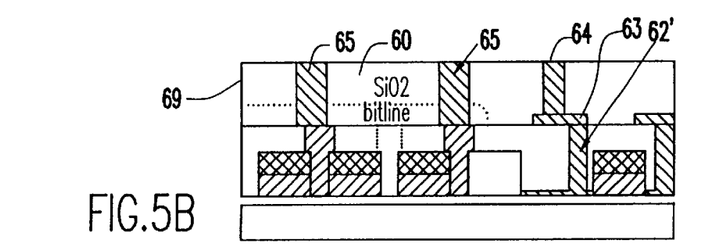

As shown in FIG. 5(b), a dielectric layer 67 of SiO$_2$ is deposited over 55 and interconnect 63 are formed by depositing and patterning silicon dioxide layer 67 to a desired thickness. A contact 62 is then formed in the transfer-gate layer 59 by reactive ion etching (RIE).

Next, the contact 62 and trenches (69 and 63)are filled with W and patterned by a chemical mechanical polishing (CMP) to form dual-damascene metal layer 63 and a contact. Another dielectric layer of SiO$_2$ is then deposited, holes are etched therein, and filled with conductive material, preferably W, and then polished using CMP to form capacitor contacts 65 and support device vias 64.

Figure 5C:
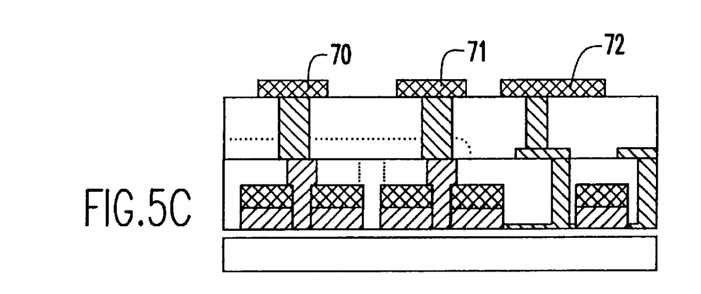
Figure 5D:
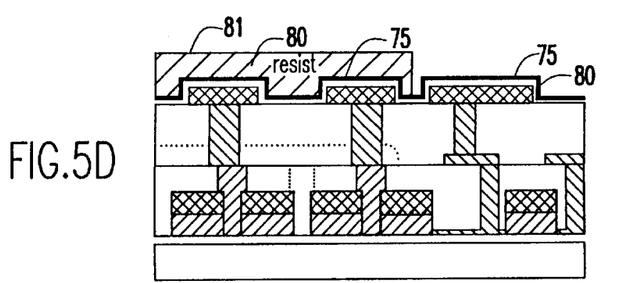
Figure 5E:
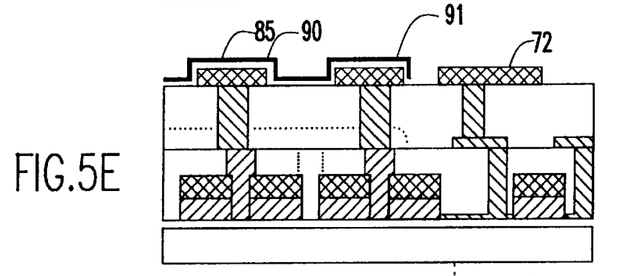

As shown in FIGS. 5(c)–5(e), an intermediate wiring level is formed over wiring level 69. The intermediate wiring level includes a blanket conductor layer which is deposited and patterned by RIE to form three electrodes 70, 71, and 72. See FIG. 5(c). Electrodes 70 and 71 form the lower electrodes of two storage capacitors. Electrode 72 is a capacitor electrode which corresponds to an intermediate wiring layer in accordance with the present invention. Electrodes 70, 71, and 72 are preferably stacked capacitor electrodes and are each deposited to a thickness of between 1000 A to 10,000 A, with 2000 A being preferable. Electrode 72 may serve as an interconnect, for example, for bit lines or support circuits in the DRAM.

As shown in FIG. 5(d), a layer of dielectric material 75 is deposited over electrodes 70, 71, and 72 to a thickness of between 30 A and 500 A. Any one of a variety of materials may be used for dielectric layer 75. If SiON is used, a thickness of 50 A is preferred, and if (Ba,Sr)TiO$_3$ is used, a thickness of 200 A is preferred. In addition, it is noted that the material used to form the blanket conductor layer must be compatible with the dielectric. This material includes polysilicon or suicides for $SiO_2$ or $Si_3N_4$ dielectrics, suicides and TiN for $Ta_2O_5$, and Pt on TiN, or Ir, $IrO_2$, $RuO_2$, and $SrRuO_3$ for $(Ba,Sr)TiO_3$.

After formation of dielectric layer 75, a layer of conductive material 80 is deposited over the dielectric layer and all three electrodes to a desired thickness of between 200 A and 10,000 A, with 1000 A being preferred. As with the blanket layer forming the lower electrodes, the conductive material of layer 80 must be compatible with the dielectric, and as such includes Al, W, Ti, TiN, silicides for $SiO_2$, SiON, or $Si_3N_4$, TiN or silicides for $Ta_2O_5$, Pt, Ir, $IrO_2$, $RuO_2$, and $SrRuO_3$ for $(Ba,Sr)TiO_3$. A resist 81 is then applied over the portion of conductive layer 80 which will serve as the upper electrodes of the storage capacitors, i.e., the portion of layer 80 which is coextensive with lower electrodes 70 and 71. See FIG. 5(d).

As shown in FIG. 5(e), a common upper electrode 85 for the storage capacitors is formed by patterning layers 75 and 80 in accordance with steps that include dry etching for the common upper electrode and wet or dry etching for the dielectric 75. At the conclusion of the steps in FIGS. 5(c)–5(e), storage capacitors 90 and 91 are formed, in addition to a lower capacitor electrode 95 which serves as the intermediate wiring layer shown in FIGS. 2 and 3.

Figure 5F:
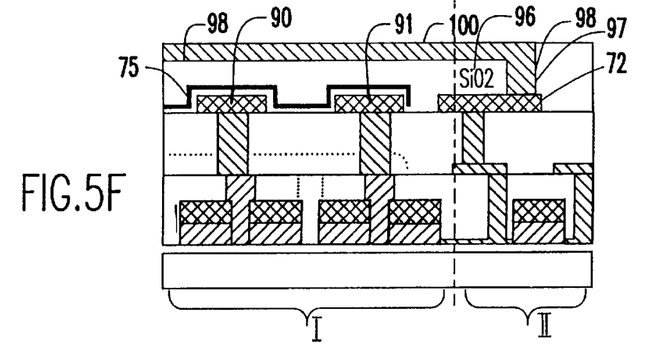

As shown in FIG. 5(f), formation of a third wiring layer begins by depositing a third $SiO_2$ layer 96 over upper electrode 80 and capacitor electrode 72. $SiO_2$ layer 96 is planarized by CMP and then patterned using lithography and RIE to form a via 98 and a trench 99. The via and trench are then filled with a metal, preferably aluminum AL, and patterned by CMP to form dual damascene stud 97 and metal layer 100. Capacitor electrode 95 may be characterized as being formed in a section II of the memory cell which corresponds to a support-circuit region, e.g., sense amplifiers, row/column address decoders, etc.

The first embodiment of the method of the present invention, thus, forms a DRAM memory cell having an intermediate wiring level between metal layers (69, 63) and 100. This intermediate wiring level includes at least one wiring layer in the form of lower capacitor electrode 72 which electrically connects metal layers 63 and 100.

Metal layers 63 and 100 may be one of a variety chip features. For example, metal layers 63 and 100 may be portions of a bit line disposed on different levels of the DRAM structure. Under these circumstances, electrode 95 may advantageously be used to establish a flipped connection between these bit lines portions. Alternatively, metal layers 63 and 100 may be interconnects attached to one or more support circuits of the DRAM, which are then connected by electrode 95 through studs 97 and 64. Still further, electrode 95 may be used to connect support circuits to a diffusion region or gate electrodes in substrate 52 via elements 64, 63, and 62 where support device 54 may eventually receive the signal.

It is further noted that lower capacitor electrode 72 may correspond to either of 16 or 17 in FIGS. 2 and 3. And, if desired, the structure shown in FIG. 5(f) may be modified to include both of electrodes 16 and 17 in the manner shown in FIG. 3, with accompanying studs being formed through levels 59, 69, and 96 behind capacitor electrode 72.

From the foregoing, it is therefore apparent that the lower capacitor electrode of the present invention, as with all other embodiments described herein, may be used for establishing any one of a variety of chip interconnections including local interconnects, within-array bit-line wiring such as bit-line flipping, twisting, and folding, and global wiring.

Referring to FIG. 6, a second embodiment of the method of the present invention forms a DRAM memory cell having a first capacitor electrode and a second capacitor electrode, both of which are used as intermediate wiring layers of the cell. Preferably, both electrodes are stacked capacitor electrodes, and at least the second capacitor electrode is formed by a damascence process. In this embodiment, the steps shown in FIGS. 6(a)–(c) are identical to the steps in FIGS. 5(a)–(d) and thus a detailed discussion of them has been omitted. Because of this identity, like references numerals have been used for consistency purposes.

Figure 6A:
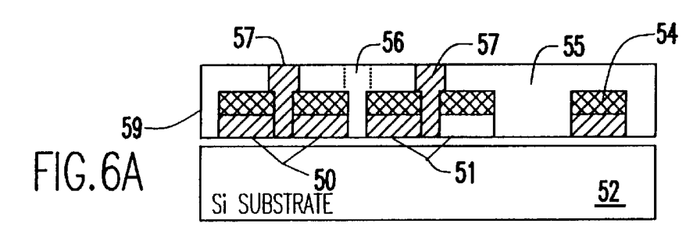
FIGS. 6(a)–(f) show steps included in a second embodiment of the method of the present invention, and a DRAM cell structure formed in accordance with those steps.
Figure 6B:
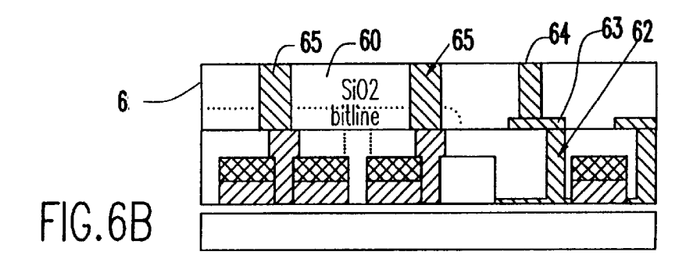
Figure 6C:
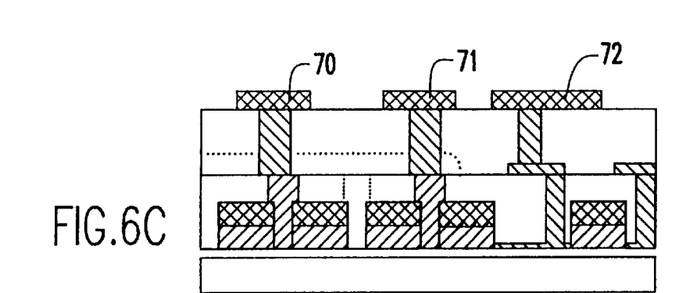
Figure 6D:
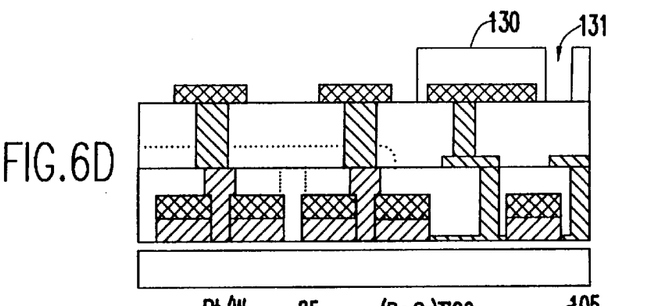

As shown in FIG. 6(d), after deposition of storage capacitor electrodes 70 and 71 and first capacitor electrode 72, an interlevel dielectric 130 is deposited, planarized and patterned by lithography and RIE to leave the dielectric layer and other support regions over capacitor electrode 72. A damascene trench 131 and damascene electrode region 132 are formed.

Figure 6E:
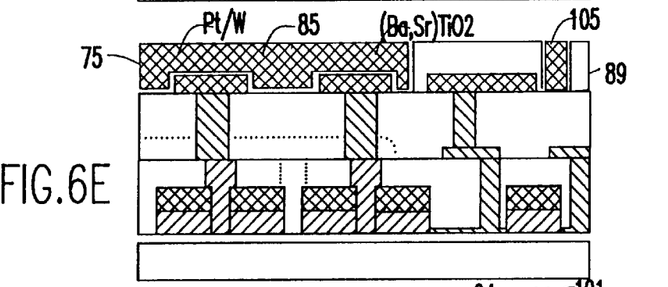

As shown in FIG. 6(e), a dielectric layer 75 is deposited in the damascene electrode region 132 and 70 and within a trench 131, after which a conductive material is deposited and planarized by CMP to form a thick, common upper electrode 85 for the storage capacitors and a second capacitor electrode 105 in accordance with the present invention. The electrode material deposited in this step must be compatible with the node dielectric, i.e., Al, W, Ti, TiN, silicides for $SiO_2$ or $Si_3N_4$, TiN or silicides for $Ta_2O_5$, Pt or Ir for $(Ba,Sr)TiO_3$.

Figure 6F:
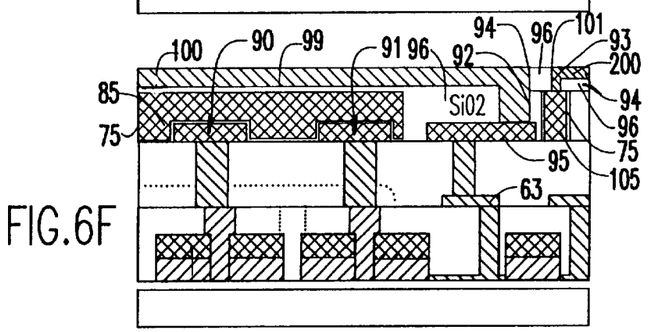

As shown in FIG. 6(f), once the first and second capacitor electrodes 95 and 105 have been formed, a third $SiO_2$ dielectric layer 96 is deposited and patterned using lithography and RIE. Next, an etch is performed to form a via 92 through the third dielectric and interlevel dielectric layers, and a via 93, trench 94, and trench 99 in the third dielectric layer. Vias 92 and 93 and trenches 94 and 99 are then filled with a conductive material such as Al and patterned by CMP, resulting in the formation of metal layers 100 and 200 and studs 97 and 101 which connect metal layers 100 and 200 to the first capacitor electrode and second capacitor electrode, respectively.

The second embodiment of the present invention, thus, forms a DRAM memory cell structure having two intermediate wiring layers. The first layer is in the form of first capacitor electrode 95 which connects metal layers 63 and 100. The second layer is second capacitor electrode 105 which connects metal layer 200 either to other circuit elements in the memory cell or to another interconnect (not shown). Through the structure of the second embodiment, therefore, two intermediate wiring layers are provided for establishing different connections. For example, capacitor electrode 95 may be used to connect bit line portions 63 and 100 at a flipped region, and capacitor electrode 105 may interconnect support circuits of the DRAM. Further, electrodes 95 and 105 may be varied in shape to provide the additional advantages.

As for materials, the first and second capacitor electrodes may be made from platinum (Pt), iridium (Ir), or a conducting oxide such as RuO2 or $IrO_2$ and the dielectric from $(Ba,Sr)TiO_3$. Furthermore, to increase circuit density, the contact studs between the capacitor electrode(s) and diffusions may be made from polysilicon, W, TiN, or polysilicides. Given this choice of materials, additional layers, if desired, may advantageously be deposited on top of the Pt or RuO$_2$ layers to lower the resistance of the second capacitor electrode, so that the first capacitor electrode can be used for global wiring.

Accordingly, the capacitor electrode of the present invention may be used for purposes other than as interconnects. For example, the lower capacitor electrode may be used (1) as a landing pad during RIE of support contacts, and (2) as a diffusion barrier for protecting the contact studs from oxidation during formation of the capacitor dielectric. (Normally, when the lower electrode is not used for wiring or a landing pad, the support contacts are formed after the capacitors, resulting in a very deep contact etch.)

While the invention has been described in terms of several illustrative embodiment, those skilled in the art will recognize that the invention can be practiced with modification within the spirit and scope of the appended claims.

We claim:

1. A method for making a DRAM memory cell, comprising:

forming a transfer gate on a first layer;

depositing a first signal line on a second layer;

depositing a second signal line on a third layer;

forming a storage capacitor on a layer between said second layer and said third layer, said storage capacitor connected to the transfer gate in said first layer;

depositing at least a first capacitor electrode in the layer in which said storage capacitor is formed;

forming a first contact stud connecting said first capacitor electrode and said first signal line; and forming a second contact stud connecting said first capacitor electrode with said second signal line.

2. The method of claim 1, further comprising:

forming said first capacitor electrode and an electrode of said storage capacitor simultaneously and in a same plane.

3. The method of claim 1, further comprising:

forming said first capacitor electrode and the electrode of said storage capacitor from a same material.

4. The method of claim 1, further comprising:

forming a second capacitor electrode in the layer in which said storage capacitor is formed;

depositing a third signal line in said third layer; and depositing a third contact stud connecting said third signal line to said second capacitor electrode.

5. The method of claim 4, wherein said second capacitor electrode is formed simultaneously with formation of a second electrode of said storage capacitor.

6. The method of claim 4, wherein said second capacitor electrode is formed from a same material as the second electrode of said storage capacitor.

7. The method of claim 4, wherein said second capacitor electrode is formed using a damascene process.

* * * * *